US006903965B2

(12) United States Patent
Ishikawa

(10) Patent No.: US 6,903,965 B2
(45) Date of Patent: Jun. 7, 2005

(54) THIN FILM MAGNETIC MEMORY DEVICE PERMITTING HIGH PRECISION DATA READ

(75) Inventor: Masatoshi Ishikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 229 days.

(21) Appl. No.: 10/334,009

(22) Filed: Dec. 31, 2002

(65) Prior Publication Data

US 2004/0012995 A1 Jan. 22, 2004

(30) Foreign Application Priority Data

Jul. 18, 2002 (JP) ........................................ 2002-209298

(51) Int. Cl.$^7$ .............................................. G11C 11/00
(52) U.S. Cl. .......................... 365/158; 365/148; 365/173
(58) Field of Search ................................. 365/158, 171, 365/173, 148, 100, 209

(56) References Cited

U.S. PATENT DOCUMENTS

| | | | |
|---|---|---|---|
| 6,504,750 B1 * | 1/2003 | Baker ........................... | 365/148 |
| 6,570,782 B1 * | 5/2003 | Brandenberger et al. ... | 365/100 |
| 2003/0067797 A1 * | 4/2003 | Baker ........................... | 365/148 |

FOREIGN PATENT DOCUMENTS

JP        2002-008369         1/2002

OTHER PUBLICATIONS

R. Scheuerlein, et al., "A 10ns Read and Write Non–Volatile Memory Array Using a Magnetic Tunnel Junction and FET Switch in Each Cell", ISSCC Digest of Technical Papers, TA7.2, Feb. 2000, pp. 94–95, 128–129, 409–410.
M. Durlam, et al., "Nonvolatile RAM based on Magnetic Tunnel Junction Elements", ISSCC Digest of Technical Papers, TA7.3, Feb. 2000, 96–97, 130–131, 410–411.
P. K. Naji, et al., "A 256kb 3.0V 1T1MTJ Nonvolatile Magnetoresistive RAM", ISSCC Digest of Technical Papers, TA7.6, Feb. 2001, 94–95, 122–123, 404–405, 438.

* cited by examiner

*Primary Examiner*—Gene Auduong
(74) *Attorney, Agent, or Firm*—Burns, Doane, Swecker & Mathis, L.L.P.

(57) ABSTRACT

An MTJ memory cell has an access transistor which turns on in response to activation of a corresponding word line and a tunneling magneto-resistance element which has an electric resistance changing in accordance with stored data. The access transistor has a source connected to a source line for supplying a ground voltage. To restrict an off leakage current in a non-selected access transistor, each access transistor is configured with a MOS transistor having a threshold voltage that is larger than that of another MOS transistor formed on the same chip.

13 Claims, 12 Drawing Sheets

US 6,903,965 B2

THIN FILM MAGNETIC MEMORY DEVICE PERMITTING HIGH PRECISION DATA READ

BACKGROUND OF THE INVENTION

1. Field of the Invention

The present invention relates to thin film magnetic memory devices, and more particularly to a thin film magnetic memory device provided with memory cells having magnetic tunnel junctions (MTJ).

2. Description of the Background Art

A magnetic random access memory (MRAM) device has attracted attention as a memory device capable of non-volatile data storage with low power consumption. The MRAM device stores data in a non-volatile manner using a plurality of thin film magnetic elements formed in a semiconductor integrated circuit, and permits random access to the respective thin film magnetic element.

FIG. 12 is a conceptual diagram illustrating a principle of storing data in a memory cell having a magnetic tunnel junction (hereinafter, also simply referred to as the "MTJ memory cell").

Referring to FIG. 12, the MTJ memory cell includes a tunneling magneto-resistance element TMR having a magneto-resistive (MR) effect with which electric resistance of a material changes according to a magnetization direction of a magnetic element. Tunneling magneto-resistance element TMR is known to exhibit a remarkable MR effect even at room temperature and have a high MR ratio (electric resistance ratio corresponding to the magnetization direction).

Tunneling magneto-resistance element TMR includes ferromagnetic films 201, 202 and an insulating film (tunneling film) 203. In tunneling magneto-resistance element TMR, an amount of tunneling current flowing through insulating film 203 sandwiched between ferromagnetic films 201 and 202 changes according to the direction of electron spins which is determined by the magnetization directions of ferromagnetic films 201 and 202. The number of states that the spinning electrons within ferromagnetic films 201, 202 can take differs depending on the magnetization directions. The tunneling current increases when ferromagnetic films 201 and 202 have the same magnetization directions, while it decreases when the two films have opposite magnetization directions from each other.

Utilizing this phenomenon, tunneling magneto-resistance element TMR can be used as a memory cell storing data of one bit, when the magnetization direction of ferromagnetic film 202 is changed in accordance with stored data while the magnetization direction of ferromagnetic film 201 is fixed, e.g., by an antiferromagnetic material, and the amount of tunneling current flowing through tunneling film 203, i.e., the electric resistance of tunneling magneto-resistance element TMR, is detected. In general, such a tunneling magneto-resistance element is also called a "spin valve".

Hereinafter, ferromagnetic film 201 having a fixed magnetization direction is also referred to as the "fixed magnetic layer", and ferromagnetic film 202 having a magnetization direction corresponding to stored data is also referred to as the "free magnetic layer".

In order to implement a high-density memory device, it is preferable to arrange MTJ memory cells formed of tunneling magneto-resistance elements TMR as described above in a two dimensional array. Generally, a ferromagnetic material has a direction in which it is easier to magnetize (requiring smaller energy for magnetization) according to its crystal structure, shape and others. This direction is commonly called an "easy axis (EA)" direction, and the magnetization direction of free magnetic layer 202 corresponding to stored data is set to the direction along the easy axis. A direction in which the ferromagnetic material is harder to magnetize (requiring greater energy for magnetization) is called a "hard axis (HA)" direction.

FIG. 13 is a conceptual diagram illustrating a data write magnetic field which is applied to an MTJ memory cell in a data write operation.

Referring to FIG. 13, the horizontal axis represents a data write magnetic field H (EA) along the easy axis direction. The vertical axis represents a data write magnetic field H (HA) along the hard axis direction. When the vector sum of data write magnetic fields H (EA) and H (HA) reaches an area outside the asteroid curve 205, the magnetization direction of tunneling magneto-resistance element TMR (i.e., magnetization direction of free magnetic film 202) is rewritten to a direction along the easy axis.

On the contrary, when the data write magnetic field within the area of asteroid curve 205 is being applied, the magnetization direction of tunneling magneto-resistance element TMR is not updated, and the stored content is held in a non-volatile manner.

As shown in FIG. 13, data write magnetic field H (EA) required for data rewriting is reduced when data write magnetic field H (HA) is applied at the same time. In other words, the operating points 206 and 207 at the data writing are represented by vector sums of data write magnetic field H (HA) of a fixed direction irrelevant to a level of write data and data write magnetic field H (EA) of a variable direction corresponding to the write data. Further, data write magnetic fields H (HA) and H (EA) at the operating points 206, 207 are designed such that they do not reach the area outside asteroid curve 205 alone.

FIG. 14 is a conceptual diagram illustrating arrangement of data write interconnections in a memory cell array formed of MTJ memory cells.

Referring to FIG. 14, in the memory cell array having tunneling magneto-resistance elements TMR constituting respective MTJ memory cells arranged in rows and columns, data write interconnections 210 and 215 are arranged in a matrix. Data write interconnections 210 and 215 are provided with data write currents for generation of one and the other of data write magnetic fields H (EA) and H (HA), respectively.

For example, assume that data write magnetic field H (HA) is generated by data write interconnections 210 and data write magnetic field H (EA) is generated by data write interconnections 215. In this case, a data write current having a fixed direction is selectively passed through data write interconnections 210, and a data write current having a direction corresponding to write data is selectively passed through data write interconnections 215. An MTJ memory cell designated as a data write target receives the data write currents from both data write interconnections 210 and 215 corresponding thereto.

As a result, selective data write to a plurality of tunneling magneto-resistance elements TMR arranged in two dimensions becomes possible by controlling the data write current supply to data write interconnections 210 and 215 in accordance with address selection.

FIG. 15 is a conceptual diagram illustrating a configuration for reading data from an MTJ memory cell.

Such a configuration is disclosed in technical documents including "A 10ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

Referring to FIG. 15, as described above, data write to an MTJ memory cell, or tunneling magneto-resistance element TMR, is carried out utilizing a magnetic field generated by data write currents flowing through a digit line DL and a bit line BL. For example, digit line DL corresponds to data write interconnection 210 shown in FIG. 14, and bit line BL corresponds to data write interconnection 215.

An access transistor ATR is provided as an access element for carrying out the data read from tunneling magneto-resistance element TMR, which turns on or off in accordance with a voltage on a word line WL. A metal oxide semiconductor (MOS) transistor is typically employed as access transistor ATR. One of source/drain regions of access transistor ATR is electrically coupled to tunneling magneto-resistance element TMR, and the other of source/drain regions is coupled to a fixed voltage such as a ground voltage.

On the data read, word line WL is activated to turn on access transistor ATR, while bit line BL is set to a voltage different from the relevant fixed voltage. Accordingly, a current corresponding to the magnetization direction of tunneling magneto-resistance element TMR, or the stored data, passes via access transistor ATR through a current path including bit line BL and tunneling magneto-resistance element TMR.

Thus, by comparing the bit line current at this time with a reference current, the magnetization direction of tunneling magneto-resistance element TMR, or the stored data in the MTJ memory cell, can be determined. Since the bit line current at the time of data read is considerably small compared to the data write current, the magnetization direction of tunneling magneto-resistance element TMR would not vary due to the current flowing during the data read. This permits non-destructive data read.

An MRAM device is provided with a memory array having such MTJ memory cells collectively arranged in rows and columns. The data read operation is performed on a "selected memory cell" designated as a data read target from within the memory array.

FIG. 16 is a circuit diagram showing a configuration for reading data from a memory array formed of MTJ memory cells.

Referring to FIG. 16, the memory array includes a plurality of MTJ memory cells MC arranged in n rows and m columns (n and m are natural numbers) and a plurality of reference cells RMC. The plurality of reference cells RMC are arranged in a column direction to form a reference cell column 11. As described above, each MTJ memory cell MC has two types of electric resistances in accordance with stored data. Hereinafter, the two types of electric resistances are expressed as Rmax and Rmin (Rmax>Rmin). Each reference cell RMC is designed to have an electric resistance of an intermediate level between Rmax and Rmin.

Word lines WL1–WLn are provided for selecting rows of MTJ memory cells (hereinafter, also simply referred to as "memory cell rows") in a data read operation. Digit lines DL1–DLn are provided for selecting the memory cell rows in a data write operation. Each word line and each digit line are shared by MTJ memory cells MC and reference cell RMC belonging to the same memory cell row.

Bit lines BL1–BLm are provided corresponding to respective columns of MTJ memory cells Hereinafter, also simply referred to as "memory cell columns"). A reference bit line BLr is provided corresponding to reference cell column 11. Selection of the memory cell columns and reference cell column is carried out using column select signals CS1–CSm, CSr.

MTJ memory cells MC each have a tunneling magneto-resistance element TMR and an access transistor ATR that are connected in series between corresponding one of bit lines BL1–BLm and a ground voltage GND. Access transistor ATR has a gate connected to corresponding one of word lines WL1–WLn.

Each reference cell RMC has a reference resistance element TMRr and an access transistor ATRr that are connected in series between reference bit line BLr and ground voltage GND. As the access transistors ATR, ATRr, a metal oxide semiconductor (MOS) transistor being a field effect transistor formed on a semiconductor substrate, in particular an N channel MOS transistor, is typically employed.

Column select gates CSG1–CSGm are provided between bit lines BL1–BLm and a data line DSL. A column select gate CSGr is connected between reference data line DSLr and reference bit line BLr. Column select gates CSG1–CSGm turn on/off in response to column select signals CS1–CSm, and column select gate CSGr turns on/off in response to column select signal CSr.

In the data read operation, the word line of a selected row is activated to a high level (hereinafter, "H level"), and the word lines of the remaining, non-selected rows are inactivated to a low level (hereinafter, "L level"). Further, the column select signal of a selected column is activated to an H level, and column select signal CSr is activated to an H level regardless of a result of address selection.

In response, access transistors ATR and ATRr belonging to the selected row turn on, and the bit line of the selected column (hereinafter, "selected bit line") having been pulled down to ground voltage GND via a selected memory cell is connected to a data reading sense amplifier 50 via data line DSL. Similarly, reference bit line BLr pulled down to ground voltage GND via a reference cell belonging to the memory cell row including the selected memory cell is connected via reference data line DSLr to data reading sense amplifier 50.

In this state, data line DSL and reference data line DSLr are pulled up with a common voltage. As a result, a memory cell current Icell in accordance with the electric resistance (or, the stored data) of the selected memory cell occurs on a current path including the selected memory cell, selected bit line and data line DSL. Memory cell current Icell has one of two types of levels in response to the stored data in the selected memory cell. A reference current Iref of a level corresponding to the middle of the two types of levels of the memory cell current occurs on a current path including the reference cell, reference data line DSLr and reference bit line BLr.

Thus, it is possible to generate read data RDT reflecting the stored data of the selected memory by detecting and amplifying a current difference between memory cell current Icell and reference current Iref by sense amplifier 50.

As described above, for the data read in the MRAM device, it is necessary to design memory cell current Icell and reference current Iref passing through a selected bit line and the reference bit line, respectively, such that they accurately reflect the electric resistances of a selected memory cell and the reference cell.

A bit line of a selected column through which the memory cell current Icell flows is connected not only with the selected memory cell but also with a plurality of non-selected memory cells belonging to the same memory cell row. In the non-selected memory cells, access transistors ATR are turned off in response to inactivation of the corresponding word lines.

However, an off leakage current occurs even in the access transistors that should be turned off, due to a sub-threshold current and a diffused leakage current from a diffusion region. Since the off leakage current also constitutes the current passing through the selected bit line, an increase of the off leakage current would cause a problem that memory cell current Icell does not necessarily represent the accurate electric resistance of the selected memory cell, leading to degradation of data read margin. The same applies to the access transistor ATRr of the reference cell.

Particularly, in order to form a system LSI (Large Scale Integrated circuit), in a configuration where the MRAM device and a logic unit are mounted on the same chip, a MOS transistor having a relatively small threshold voltage is employed in the logic unit for a high speed operation. With such a MOS transistor, although such a high speed operation may be expected as the operating current upon turning on is large, the off leakage current would also become when turning on.

If the MOS transistor used in the logic unit is also employed as the access transistor of the MTJ memory cell, the data read margin will decrease in the MRAM device due to an influence of the off leakage current, thereby hindering stabilization of the circuit operation.

SUMMARY OF THE INVENTION

An object of the present invention is to provide a thin film magnetic memory device having high data read margin, with a leakage current generated in a non-selected MTJ memory cell being restricted.

A thin film magnetic memory device according to the present invention includes a plurality of memory cells arranged in rows and columns, a plurality of word lines provided corresponding to the rows and selectively activated in a row including a selected memory cell that is selected from among the plurality of memory cells as a data read target, a plurality of bit lines arranged corresponding to the columns, and a data read circuit generating read data based on a current passing through that one of the plurality of bit lines which corresponds to the selected memory cell. The plurality of memory cells each include a magnetic storage element having an electric resistance changing in accordance with stored data and an access element turning on in response to activation of the corresponding one of the word lines which are connected in series between the corresponding bit line and a fixed voltage. The access element has a first field effect transistor having a gate coupled to the corresponding word line, and the first field effect transistor has a threshold voltage that is greater than a threshold voltage of another field effect transistor arranged on the same chip.

Accordingly, a major advantage of the present invention is that an off leakage current produced in the access element (access transistor) in a non-selected row can be restricted, because the field effect transistor used as the access transistor has a large threshold voltage in the thin film magnetic memory device. As a result, the selected bit line precisely reflects the electric resistance of the memory cell selected as the data read target, so that data read margin improves.

A thin film magnetic memory device of another configuration according to the present invention includes a plurality of memory cells arranged in rows and columns, a plurality of word lines provided corresponding to the rows and selectively activated in a row including a selected memory cell that is selected from among the plurality of memory cells as a data read target, a plurality of word line voltage control circuits provided corresponding to the plurality of word lines for setting the word line of a selected row and the word line of a non-selected row to a first voltage and a second voltage, respectively, in a data read period, a plurality of bit lines arranged corresponding to the columns, and a data read circuit generating read data based on a current passing through that one of the bit lines which corresponds to the selected memory cell. The plurality of memory cells each include a magnetic storage element having an electric resistance changing in accordance with stored data and an access element turning on in response to activation of corresponding one of the word line which are connected in series between corresponding one of the plurality of bit lines and a fixed voltage. The access element has a field effect transistor having a gate coupled to the corresponding word line. The first and second voltages have different polarities from each other with respect to the fixed voltage.

In the thin film magnetic memory device as described above, the off leakage current of the access element (access transistor) in a non-selected row can be restricted by controlling the voltage of the word line, i.e., by controlling the gate voltage of the access transistor. As a result, the selected bit line precisely reflects the electric resistance of the memory cell selected as the data read target, and thus, the data read margin improves.

A thin film magnetic memory device of yet another configuration according to the present invention includes a plurality of memory cells arranged in rows and columns, a plurality of word lines provided corresponding to the rows and selectively activated in the row including a selected memory cell that is selected from among the plurality of memory cells as a data read target, a plurality of source lines provided corresponding to the rows, a plurality of bit lines arranged corresponding to the columns, and a data read circuit generating read data based on a current passing through that one of the plurality of bit lines which corresponds to the selected memory cell. The plurality of memory cells each include a magnetic storage element having an electric resistance changing in accordance with stored data and an access element turning on in response to activation of corresponding one of the word lines which are connected in series between corresponding one of the plurality of bit lines and corresponding one of the plurality of source lines, and the access element has a field effect transistor having a gate coupled to the corresponding one of the word lines. The thin film magnetic memory device further includes a plurality of source line voltage control circuits provided corresponding to the plurality of source lines, and the plurality of source line voltage control circuits, in a data read period, switch a voltage of the source line having the corresponding word line inactivated, to a level enabling reverse-bias of the field effect transistor.

In the thin film magnetic memory device as described above, the off leakage current of the access element (access transistor) of a non-selected row can be restricted, as the relevant access transistor is reverse-biased by controlling the voltage of the source line, i.e., the source voltage of the access transistor. As a result, the selected bit line comes to precisely reflect the electric resistance of the memory cell selected as a data read target, and thus, the data read margin improves.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
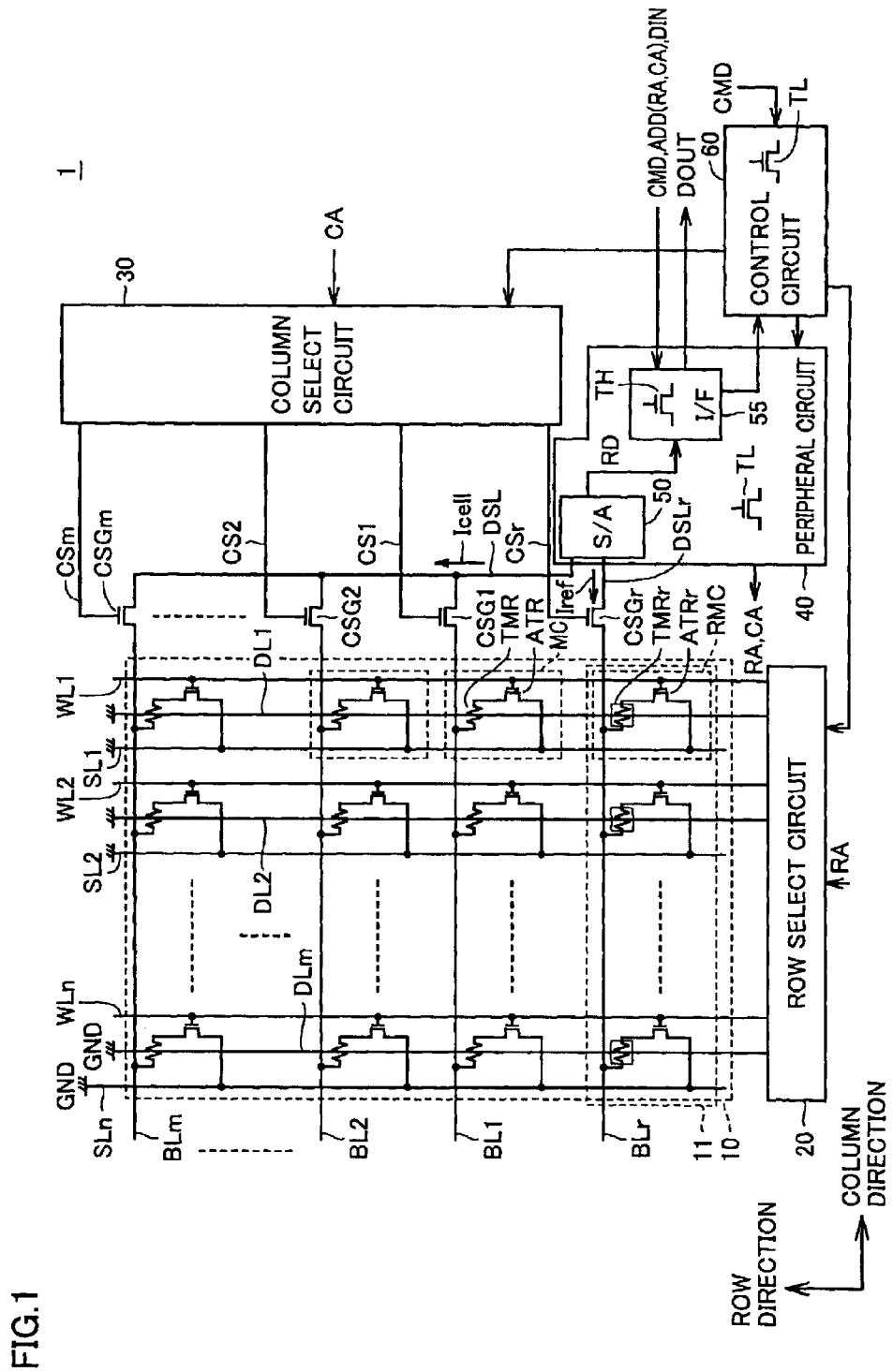
FIG. 1 is a block diagram showing an MRAM device according to a first embodiment of the present invention.

Hereinafter, embodiments of the present invention will be described in detail with reference to the drawings. In the drawings, the same or corresponding portions are denoted by the same reference characters.

First Embodiment

Referring to FIG. 1, the MRAM device 1 according to the first embodiment of the present invention includes a memory array 10, a row select circuit 20, a column select circuit 30, a peripheral circuit 40, and a control circuit 60.

Figure 16:
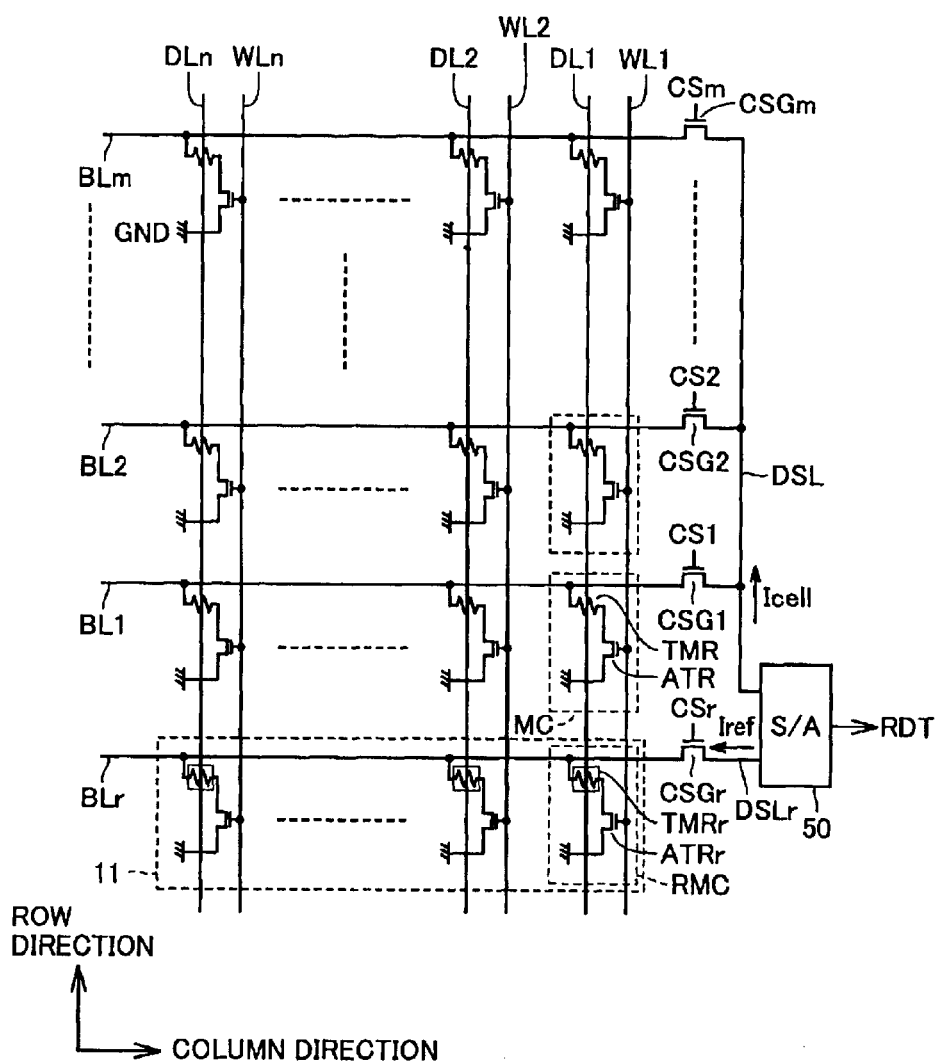
FIG. 16 is a circuit diagram showing a configuration for reading data from a memory array formed of the MTJ memory cells.

Memory array 10 has the same configuration as shown in FIG. 16, and includes MTJ memory cells (hereinafter, also simply referred to as the ("memory cells") arranged in n rows and m columns, and a plurality of reference cells RMC arranged to form a reference cell column 11.

As described above, word lines WL1–WLn and digit lines DL1–DLn are arranged corresponding to the rows of MTJ memory cells (hereinafter, also simply referred to as the "memory cell rows"). Bit lines BL1–BLm are provided corresponding to the memory cell columns, and reference bit line BLr is arranged corresponding to the reference cell column. A plurality of reference cells RMC share memory cell rows with a plurality of MTJ memory cells MC. Column select gates CSG1–CSGm, CSGr, column select signals CS1–CSm, CSr, data line DSL and reference data line DSLr are also arranged in the same manner as in FIG. 16, and thus, detailed description thereof is not repeated here.

In addition, source lines SL1–SLn are arranged corresponding to the respective memory cell rows, to supply ground voltage GND. Each of MTJ memory cells MC includes a tunneling magneto-resistance element TMR and an access transistor ATR connected in series between corresponding one of bit lines BL1–BLm and corresponding one of source lines SL1–SLn. Access transistor ATR has its gate connected to corresponding one of word lines WL1–WLn.

Each reference cell RMC includes a reference resistance element TMRr and an access transistor ATRr connected in series between reference bit line BLr and corresponding one of source lines SL1–SLn. As described above, N channel MOS transistors are typically employed as access transistors ATR, ATRr, and thus, the case where N channel MOS transistors are adapted to the access transistors is described in the following. However, the present invention is also applicable to the case where P channel MOS transistors are adapted to the access transistors by reversing the polarities of source voltage and gate voltage appropriately, as will be described later.

Reference cell RMC is designed to have an electric resistance of an intermediate level, preferably (Rmax+Rmin)/2, of two types of electric resistances Rmax, Rmin of each memory cell MC. A reference cell having such a characteristic can be implemented, e.g., as follows. Reference resistance element TMRr is designed to have the same configuration as tunneling magneto-resistance element TMR in memory cell MC, and stored data corresponding to electric resistance Rmin is written therein in advance. Access transistor ATRr is then designed to have a different size from access transistor ATR. Alternatively, access transistor ATRr is designed to have the same configuration as access transistor ATR, and then electric resistance of reference resistance element TMRr is set to (Rmax+Rmin)/2.

In a data read operation, row select circuit 20 activates a word line of a selected row and inactivates a word line of a non-selected row in accordance with a row address RA. Digit lines DL1–DLn are inactivated in the data read operation. In a data write operation, row select circuit 20 activates a digit line of a selected row and inactivates a digit line of a nonselected row in accordance with row address RA. Word lines WL1–WLn are inactivated in the data write operation.

A configuration of row select circuit 20 is now explained.

Figure 2:
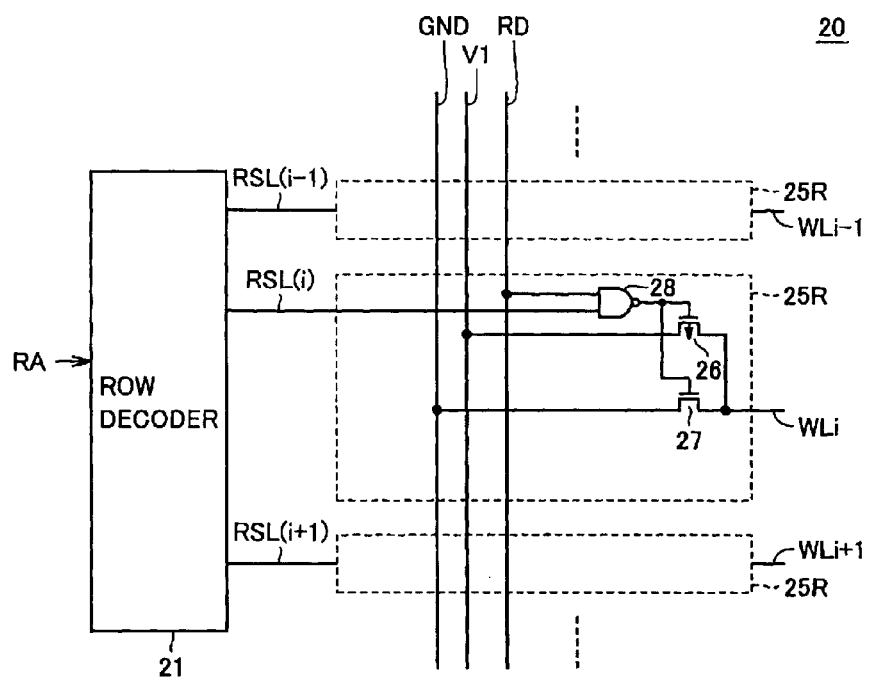
FIG. 2 is a circuit diagram showing a configuration of a portion of the row select circuit of the first embodiment corresponding to word line control.

The configuration of a portion of row select circuit 20 associated with word line control is shown in FIG. 2.

Referring to FIG. 2, row select circuit 20 includes a row decoder 21, and word line voltage control circuits 25R arranged for respective word lines WL. In FIG. 2, the circuit configuration corresponding to the i-th word line WLi (i is a natural number from 1 to n) is mainly shown.

Row decoder 21 selectively activates a row select signal RSL in response to row address RA. For example, when the i-th row is selected, row select signal RSL(i) is set to an H level, and the other row select signals are set to an L level.

Word line voltage control circuit 25R includes a transistor switch 26 connected between a positive voltage V1 and word line WLi, a transistor switch 27 connected between ground voltage GND and word line WLi, and a logic gate 28 for controlling gate voltages of transistor switches 26 and 27. Transistor switch 26 is formed of a P channel MOS transistor, and transistor switch 27 is formed of an N channel MOS transistor.

Logic gate 28 outputs a NAND operation result of a control signal RD and corresponding row select signal RSL(i) to the gates of transistor switches 26 and 27. Control signal RD, in a data read operation, is set to an H level corresponding to a data read period (hereinafter, also referred to as the "read sense operation period") where a current is passed through a selected memory cell. Transistor switches 26 and 27 complementarily turn on/off in response to an output of logic gate 28.

With such a configuration, word line WLi is coupled to positive voltage V1 in the data read operation where the i-th row is selected, and otherwise coupled to ground voltage GND. That is, positive voltage V1 corresponds to a word line voltage in the activated state, and ground voltage GND corresponds to a word line voltage in the inactivated state. Although not shown in detail, the same configuration as described above is arranged for each word line.

Figure 3:
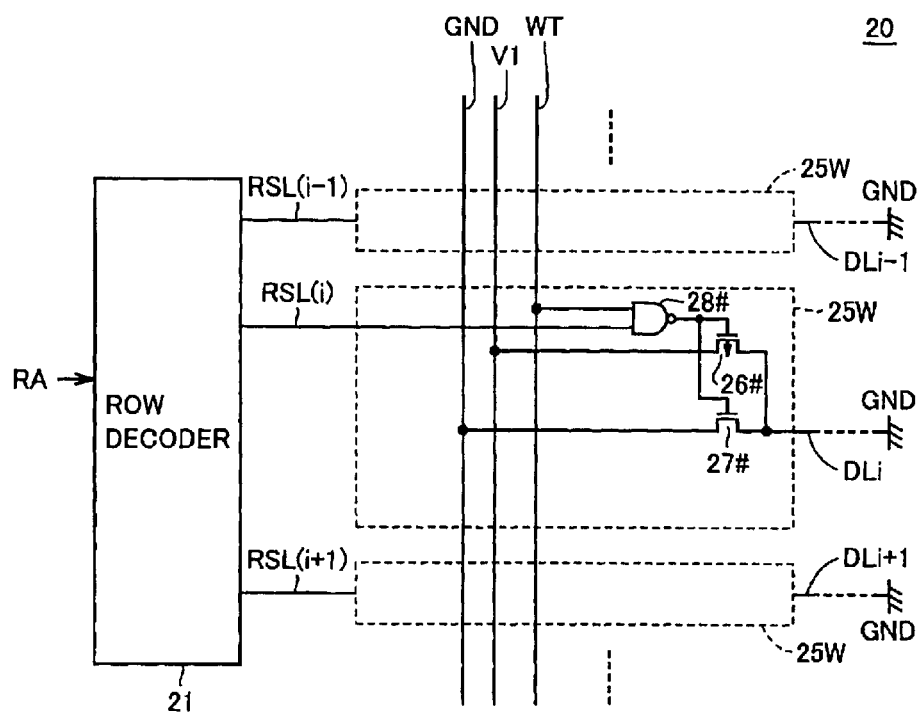
FIG. 3 is a circuit diagram showing a configuration of a portion of the row select circuit corresponding to digit line control.

The configuration of a portion of row select circuit 20 associated with digit line control is shown in FIG. 3.

Referring to FIG. 3, row select circuit 20 has a row decoder 21, and digit line drive circuits 25W arranged for respective digit lines DL. In FIG. 3, again, the circuit configuration corresponding to the i-th word line WLi (i is a natural number from 1 to n) is mainly shown. Row decoder 21 can be shared by word line voltage control circuits 25R and digit line drive circuits 25W.

Digit line drive circuit 25W includes a transistor switch 26# connected between positive voltage V1 and one end of digit line DLi, a transistor switch 27# connected between ground voltage GND and digit line DLi, and a logic gate 28# for controlling the gate voltages of transistor switches 26# and 27#. Transistor switch 26# is formed of a P channel MOS transistor, and transistor switch 27# is formed of an N channel MOS transistor.

Logic gate 28# outputs a NAND operation result of a control signal WT and corresponding row select signal RSL(i) to the gates of transistor switches 26# and 27#. Control signal WT, in a data write operation, is set to an H level corresponding to a data write current supplying period. Transistor switches 26# and 27# complementarily turn on/off in response to an output of logic gate 28#.

With the other end of each digit line DL being connected to ground voltage GND, digit line DLi is coupled to positive voltage V1 in the data write operation where the i-th row is selected, and is otherwise coupled to ground voltage GND. As a result, a data write current corresponding to the current driving capability of transistor switch 26# is supplied to digit line DL of the selected row. The direction of the data write current passed through digit line DL is constant irrelevant to the level of the write data. That is, the magnetic field produced by the data write current acts on the hard axis direction in a selected memory cell. Although not shown in detail, the identical configuration is arranged for each digit line.

Referring again to FIG. 1, in both the data read operation and the data write operation, column select circuit 30 activates one of column select signals CS1–CSm corresponding to a selected column to an H level, and inactivates the column select signals of non-selected columns to an L level. In response, the column select gate of the selected column turns on, and the selected bit line is connected to data line DSL. Column select circuit 30, in the data read operation, activates column select signal CSr to an H level irrelevant to column address CA. In the data write operation, column select signal CSr is inactivated (to an L level) regardless of column address CA.

Bit line drivers are provided at both ends of respective bit lines BL1–BLm to cause a data write current to flow through a bit line of a selected column.

Figure 4:
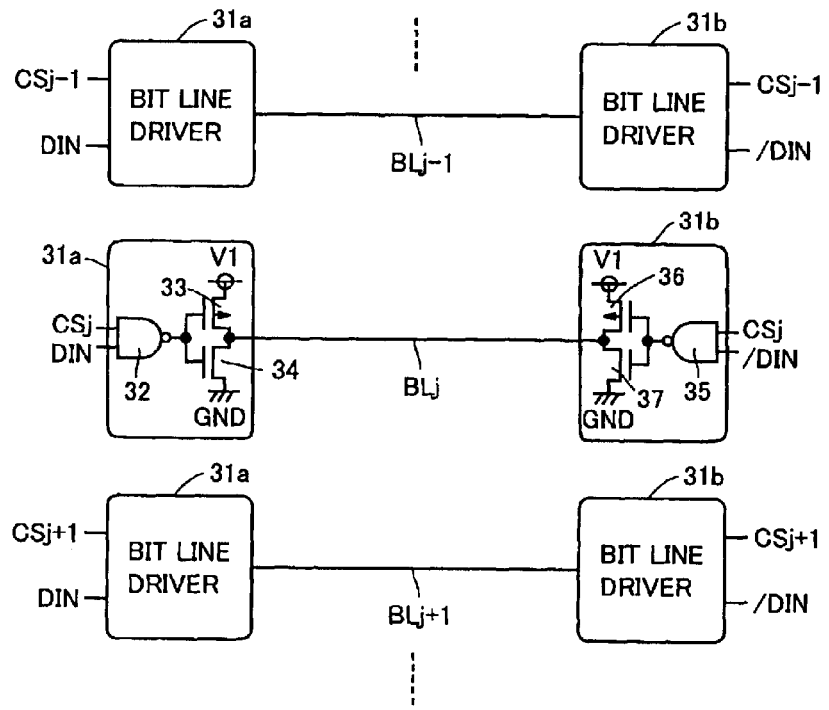
FIG. 4 is a circuit diagram showing a configuration of a bit line driver.

FIG. 4 is a circuit diagram showing configurations of the bit line drivers. Referring to FIG. 4, bit line drivers 31a and 31b are arranged corresponding to one end and the other end of each bit line. In FIG. 4, the configurations of the bit line drivers corresponding to the j-th bit line BLj (j is a natural number from 1 to m) are shown.

Bit line driver 31a has a logic gate 32, and transistors 33 and 34 constituting a CMOS inverter. Logic gate 32 outputs a NAND operation result of column select signal CSj corresponding to bit line BLj and write data DIN. Transistor 33, formed of a P channel MOS transistor, is provided between one end of bit line BLj and positive voltage V1. Transistor 34, formed of an N channel MOS transistor, is provided between the same end of bit line BLj and ground voltage GND. Transistors 33 and 34 have their gate voltages controlled by an output of logic gate 32.

Bit line driver 31b has a logic gate 35, and transistors 36 and 37 constituting a CMOS inverter. Logic gate 35 outputs a NAND operation result of column select signal CSj and inverted write data /DIN. Transistor 36, formed of a P channel MOS transistor, is provided between the other end of bit line BLj and positive voltage V1. Transistor 37, formed of an N channel MOS transistor, is provided between the other end of bit line BLj and ground voltage GND. Gate voltages of transistors 36 and 37 are controlled by an output of logic gate 35.

When bit line BLj is not selected, the outputs of logic gates 32 and 35 are set to an H level. Thus, the both ends of bit line BLj are connected to ground voltage GND.

By comparison, when bit line BLj is selected, bit line driver 31a connects one end of bit line BLj to one of positive voltage V1 and ground voltage GND in response to a data level of write data DIN, and bit line driver 31b connects the other end of bit line BLj to the other of positive voltage V1 and ground voltage GND complementarily to bit line driver 31a.

As a result, bit line BL of the selected column is provided with a data write current corresponding to the current driving capabilities of transistors 33, 34, 36 and 37. The direction of the data write current passed through bit line BL is set in accordance with the level of write data. The magnetic field produced by the data write current acts on the easy axis direction in the selected memory cell. Although not shown in detail, the same configuration as described is arranged for each bit line.

It is assumed that each bit line driver 31a, 31b is separated from corresponding bit line BL at least in the data read operation.

Peripheral circuit 40 includes a sense amplifier 50 which amplifies and senses a current difference between memory cell current Icell and reference current Iref passing thorough data line DSL and reference data line DSLr, respectively, to generate read data RDT, and an interface circuit 55 which sends/receives data and signals to/from the outside of MRAM device 1. For example, read data RDT generated by sense amplifier 50 is output to the outside of MRAM device 1 as output data DOUT driven by interface circuit 55. A command control signal CMD for providing an operation command to MRAM device 1, an address signal ADD for indicating row address RA and column address CA, and input data DIN indicating write data to MRAM device 1 are transmitted to the inside of MRAM device 1 via interface circuit 55.

Figure 5:
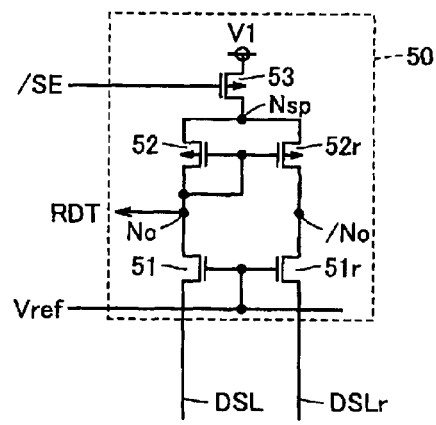
FIG. 5 is a circuit diagram showing a configuration of the sense amplifier shown in FIG. 1.

FIG. 5 is a circuit diagram showing a configuration of sense amplifier 50.

Sense amplifier 50 includes an N channel MOS transistor 51 connected between a node No and data line DSL, an N channel MOS transistor 51r connected between a node /No and reference data line DSLr, a P channel MOS transistor 52 connected between a node Nsp and node No, a P channel MOS transistor 52r connected between node Nsp and node /No, and a P channel MOS transistor 53 connected between positive voltage V1 and node Nsp. The power supply voltage of sense amplifier 50 may be a separate voltage independent from positive voltage V1.

Transistors 52 and 52r have their gates connected to node No. Transistors 52 and 52r constitute a current mirror, and attempt to supply the same current to nodes No and /No.

Transistors 51 and 51r have their gates receiving a prescribed reference voltage Vref. Reference voltage Vref is set to approximately 400 mV taking into account the reliability of tunneling film (insulating film) in the tunneling magneto-resistance element and others. As such, memory cell breakdown due to excess voltage application is avoided, and operational reliability improves.

Transistors 51 and 51r maintain data line DSL and reference data line DSLr to voltage levels not greater than reference voltage Vref, and also amplify and convert a difference between currents passing through data line DSL and reference data line DSLr to a voltage difference between nodes No and /No. As a result, the voltage difference $\Delta V$ between nodes No and /No has a polarity corresponding to the stored data in the selected memory cell. Thus, read data RDT can be generated based on the voltage of node No.

Transistor 53 has its gate receiving a sense enable signal /SE that is activated to an L level during a read sense operation period. Transistor 53 supplies an operating current in response to activation (to an L level) of sense enable signal /SE to make sense amplifier 50 operate.

Control circuit 60 generally represents a functional portion for controlling the internal operation of MRAM device 1 in response to command control signal CMD and others being input to interface circuit 55.

Peripheral circuit 40 and control circuit 60 include a logic circuit portion for controlling the overall operation of MRAM device 1. The logic circuit portion is formed of a transistor TL having a small threshold voltage (or a low threshold voltage in the case of N channel type), since high-speed operation is required. Alternatively, the relevant transistor TL is placed in a logic circuit portion arranged on the same chip as MRAM device 1.

By comparison, in interface circuit 55 or the like, a transistor TH having a large threshold voltage (or a high threshold voltage in the case of N channel type), to prevent a through current and a leakage current in the input buffer and output buffer portion.

Transistors TL and TH are each formed of a MOS transistor (field effect transistor). The threshold voltage of the MOS transistor can be set to a different level by adjusting impurity concentration to be introduced into a substrate of the transistor, or by adjusting a film thickness of oxide film formed beneath the gate.

In the configuration according to the first embodiment, to restrict the off leakage currents in access transistors ATR, ATRr of non-selected rows, access transistors ATR, ATRr constituting respective memory cells MC and reference cells RMC are each formed of a MOS transistors having a large threshold voltage.

For example, if access transistors ATR, ATRr are designed the same as transistor TH of a large threshold voltage being used in interface circuit 55, then a configuration for preventing an off leakage current is achieved without increasing the number of types of transistors in entire MRAM device 1 or the entire chip, i.e., without increasing the number of process steps.

In the configuration described above, access transistors ATR, ATRr are configured with MOS transistors having large threshold voltages. As such, there exist on the same chip MOS transistors having such large threshold voltages and MOS transistors having smaller threshold voltages arranged in a circuit portion for which high speed operation is required.

Transistor 26# in digit line drive circuit 25W and transistors 33, 34, 36 and 37 in bit line drivers 31a, 31b also need to be configured with transistors TL with small threshold voltages so as to supply sufficient data write currents. If these transistors are configured with transistors TH with large threshold voltages, it will be necessary to increase transistor size and/or power supply voltage (positive voltage V1) to supply sufficient data write currents. In such a case, circuit area and/or power consumption will increase undesirably.

Similarly, transistors 51, 51r, 52, 52r and 53 in sense amplifier 50 need to be configured with transistors TL of small threshold voltages for speeding the data read operation. In other words, high speed data read would not be ensured if these transistors are formed with transistors TH of large threshold voltages.

Figure 6:
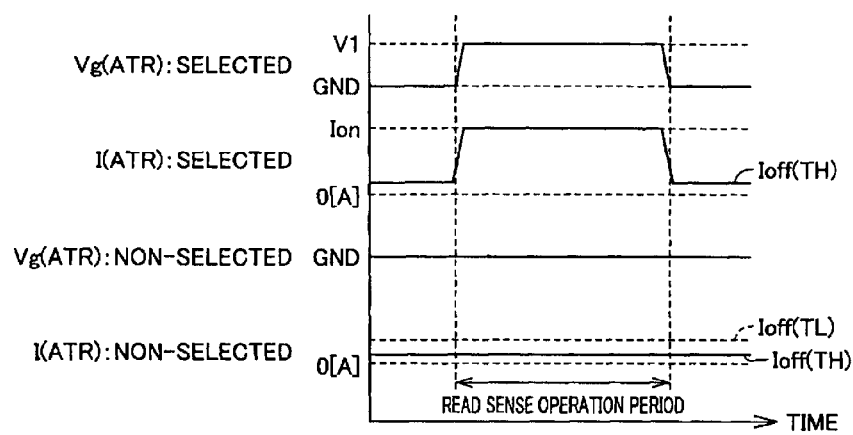
FIG. 6 shows operational waveforms illustrating gate voltages and through currents of access transistors in a data read operation according to the first embodiment.

FIG. 6 shows operational waveforms illustrating gate voltages and through currents of access transistors in a data read operation according to the first embodiment.

Referring to FIG. 6, each word line WL is inactivated and set to ground voltage GND during a period other than a read sense operation period. In response, the gate voltage Vg (ATR) of each access transistor ATR, ATRr is set to ground voltage GND. Since the source voltage of each access transistor ATR, ATRr is fixed to ground voltage GND by its corresponding source line, the gate voltage by itself corresponds to the gate-source voltage.

Although each access transistor ATR, ATRr is turned off because the gate-source voltage is 0 [V], an off leakage current Ioff corresponding to the threshold voltage is generated inevitably. In FIG. 6, the off leakage currents of transistors TH and TL when the source voltage and the gate voltage are at the ground voltage GND level (0 [V]) are shown as Ioff (TH) and Ioff (TL), respectively.

When a data read operation is started, word line WL of a selected row is activated during a read sense operation period, and gate voltage Vg (ATR) rises from ground voltage GND to positive voltage V1. The gate-source voltage becomes V1 exceeding the threshold voltage, and thus, the access transistors of the selected row are turned on, and the through current I (ATR) thereof changes to a current Ion corresponding to the memory cell current. That is, it is necessary to set positive voltage V1 to a level sufficiently high to enable turn-on of N channel MOS transistor TH of a high threshold voltage.

By comparison, word line WL of a non-selected row maintains an inactive state, and gate voltage Vg (ATR) is maintained at ground voltage GND. Thus, the access transistors in the non-selected row maintain an off state, and the through current I (ATR) thereof is also maintained at off leakage current Ioff (TH).

As such, configuring access transistors ATR, ATRr with N channel MOS transistors having high threshold voltages makes it possible to restrict the off leakage current that would be passed to a selected bit line together with the memory cell current in the read sense operation period. That is, by configuring access transistor ATR with a MOS transistor having a large threshold voltage, it is possible to make the off leakage current lower than off leakage current Ioff (TL) of the case where MOS transistors having small threshold voltages are adapted to access transistors ATR, ATRr.

As a result, an influence of the off leakage current produced in a non-selected memory cell on the memory cell current flowing through a selected bit line is restricted. The similar effect is enjoyed in the reference cell RMC generating a reference current. Accordingly, a current difference between the memory cell current and the reference current flowing through a selected bit line and the reference bit line, respectively, comes to precisely reflect an electric resistance difference between a selected memory cell and a reference cell, so that the data read margin improves.

Second Embodiment

In the second embodiment, a configuration for restricting the off leakage current by controlling the gate voltages of access transistors is explained.

Figure 7:
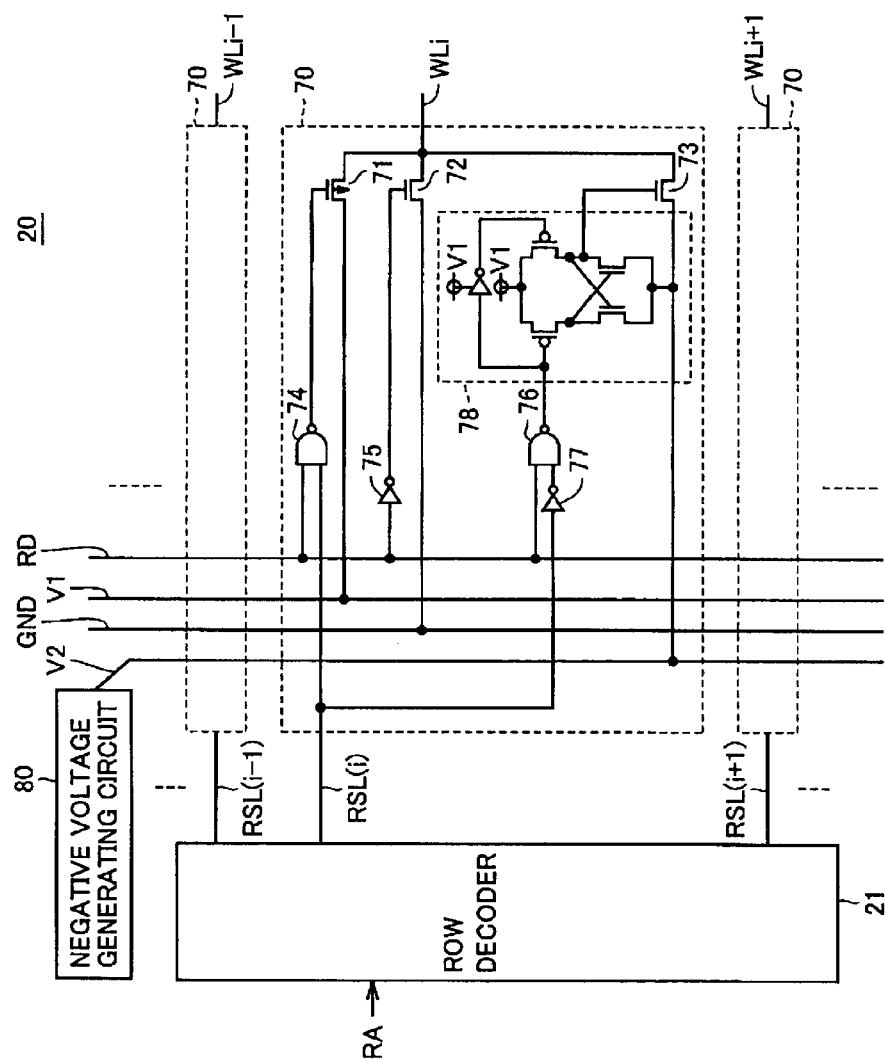
FIG. 7 is a circuit diagram showing a configuration of a portion for word line control in a row select circuit according to a second embodiment of the present invention.

FIG. 7 is a circuit diagram showing a configuration of a portion associated with word line control in the row select circuit according to the second embodiment. The configuration of the second embodiment is basically identical to that of the first embodiment, except for the configuration of row select circuit 20. Furthermore, it is unnecessary to take an off leakage current into particular consideration when designing threshold voltages of access transistors ATR, ATRr, as will be apparent from the explanation below.

Referring to FIG. 7, the row select circuit according to the second embodiment differs from that of the first embodiment shown in FIG. 2 in that word line voltage control circuits 70, instead of word line voltage control circuit 25R, are arranged for respective word lines WL. In FIG. 7, again, the configuration of the word line voltage control circuit corresponding to the i-th word line WLi is shown.

Word line voltage control circuit 70 has a transistor switch 71 connected between positive voltage V1 and word line WLi, a transistor switch 72 connected between ground voltage GND and word line WLi, and a transistor switch 73 connected between a negative voltage V2 and word line WLi. Negative voltage V2 is generated by a negative voltage generating circuit 80. Transistor switch 71 is formed of a P channel MOS transistor, and transistor switches 72 and 73 are formed of N channel MOS transistors.

Word line voltage control circuit 70 further has a logic gate 74 for controlling the gate voltage of transistor switch 71, an inverter 75 for controlling the gate voltage of transistor switch 72, and a logic gate 76, an inverter 77 and a level shifter 78 for controlling the gate voltage of transistor switch 73.

Logic gate 74 outputs a NAND operation result of control signal RD and row select signal RSL(i) to the gate of transistor switch 71. Inverter 75 inverts control signal RD and applies the inverted signal to the gate of transistor switch 72. Inverter 77 inverts row select signal RSL(i). Logic gate 76 outputs a NAND operation result of row select signal RSL(i) inverted by inverter 77 and control signal RD. Level Shifter 78 shifts a level of the output voltage of logic gate 76. Specifically, level shifter 78 sets the gate voltage of switching transistor 73 at negative voltage V2, when the output of logic gate 76 is L level. In response to this, transistor switch 73 is surely turned off. By comparison, level shifter 78 sets the gate voltage of switching transistor 73 at positive voltage V1 when the output of logic gate 76 is H level. In this case, switching transistor 73 turns on. As level shifter 78 may has a conventional circuit structure, the detailed description of level shifter 78 is omitted.

Thus, in a period other than the read sense operation period, transistor switch 72 turns on, and word line WLi is connected to ground voltage GND. By comparison, in the read sense operation period, transistor switch 71 turns on when the i-th row is selected, and transistor switch 73 turns on when the i-th row is not selected.

As a result, each word line is set to ground voltage GND in a period other than the read sense operation period. In the read sense operation period, the word line of the selected row is set to positive voltage V1, and the non-selected word line is set to negative voltage V2. As such, in the configuration according to the second embodiment, in the read sense operation period, the word line of the selected row and the word line of the non-selected row are respectively set to positive voltage V1 and negative voltage V2 having different polarities from each other, with respect to the source voltages of access transistors ATR, ATRr, i.e., ground voltage GND (0 [V]).

Figure 8:
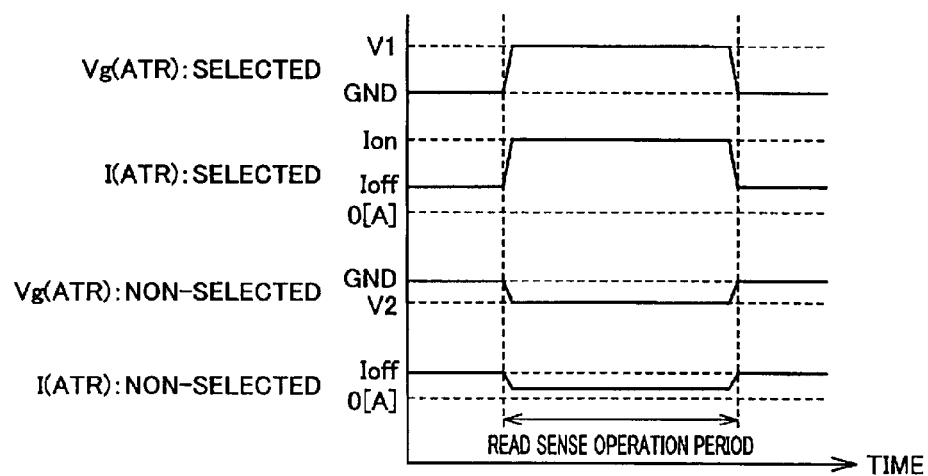
FIG. 8 shows operational waveforms illustrating gate voltages and through currents of access transistors in a data read operation according to the second embodiment.

FIG. 8 shows operational waveforms illustrating gate voltages and through currents of access transistors in a data read operation according to the second embodiment.

Referring to FIG. 8, each word line WL is inactivated in a period other than the read sense operation period. Thus, the gate voltage Vg (ATR) of each access transistor ATR, ATRr is set to ground voltage GND. As a result, each access transistor ATR, ATRr is turned off because of the gate-source voltage of 0 [V], and off leakage current Ioff corresponding to the threshold voltage flows therethrough.

When the data read operation is started, word line WL of a selected row is activated in the read sense operation period, and the gate voltage Vg (ATR) of each access transistor ATR, ATRr rises from ground voltage GND to positive voltage V1. Correspondingly, the access transistors in the selected row turn on, as described above in conjunction with FIG. 6, and the through current I (ATR) thereof changes to current Ion corresponding to the memory cell current. It is necessary to set positive voltage V1 taking into consideration the threshold voltages of access transistors ATR, ATRr.

By comparison, word line WL of a non-selected row is connected to negative voltage V2, and the gate voltages Vg (ATR) of the corresponding access transistors ATR, ATRr are set to negative voltage V2. As a result, access transistors ATR, ATRr of the non-selected row are reverse-biased, with the gate-source voltage becoming negative. As such, in the read sense operation period, it is possible to restrict the off leakage current produced in the access transistors in the non-selected row. With such a configuration, the off leakage current can be restricted without a need to set the threshold voltages of access transistors ATR, ATRr to a large voltage level. Generally with the N channel MOS transistor, the leakage current decreases to approximately one-tenth as the gate voltage is decreased by 0.1 V.

As a result, it is possible to restrict an influence of the off leakage current produced in a non-selected memory cell on the memory cell current passing through the selected bit line.

The similar effect is enjoyed in reference cell RMC generating a reference current.

As such, a current difference between the memory cell current and the reference current flowing through the selected bit line and the reference bit line, respectively, comes to precisely reflect the electric resistance difference between the selected memory cell and the reference cell, so that the data read margin improves.

The gate of access transistor ATR is configured to receive ground voltage GND, instead of negative voltage V2, in a period other than the read sense operation period, as shown in FIG. 8. Accordingly, it is possible to restrict power consumption of negative voltage generating circuit 80 for generating negative voltage V2.

In addition, each word line and gates of access transistors ATR, ATRr are likely to produce short-circuit currents with other nodes while the negative voltage is being applied. The short-circuit current generated may cause fatal failures such as malfunction due to a decreased power supply voltage level and an increase of power consumption in an operation other than the data read operation (in particular at stand-by). Thus, by limiting the negative voltage supplying period to only the read sense operation period where the off leakage current should be restricted, it is possible to improve the data read margin and, at the same time, to improve operational reliability by preventing generation of the short-circuit current in an operation other than the data read operation.

Third Embodiment

In the third embodiment, a configuration for restricting the off leakage current by controlling the source voltages of access transistors ATR is explained.

Figure 9:
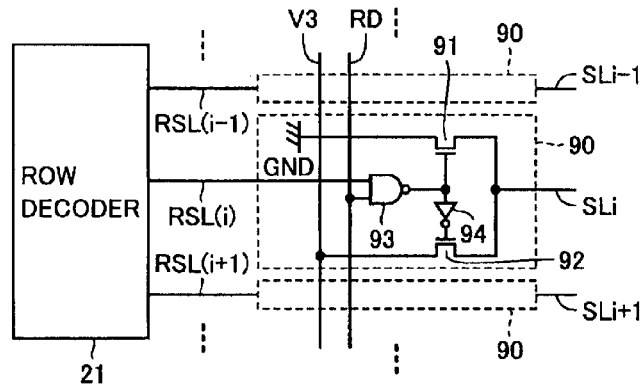
FIG. 9 is a circuit diagram showing a configuration of a source line voltage control circuit according to a third embodiment of the present invention.

FIG. 9 is a circuit diagram showing a configuration of a source line voltage control circuit according to the third embodiment.

The configuration of the third embodiment is basically identical to that of the first embodiment except that the source line voltage control circuit 90 shown in FIG. 9 is arranged for respective source line SL. Furthermore, it is unnecessary to take the off leakage current into particular consideration when designing threshold voltages of access transistors ATR, ATRr, as will be apparent from the explanation below.

Source line voltage control circuit 90 controls a voltage of corresponding source line SL in accordance with a row selection result of row decoder 21, i.e., row select signal RSL. In FIG. 9, again, the configuration of the source line voltage control circuit corresponding to the i-th row is shown representatively.

Source line voltage control circuit 90 has a transistor switch 91 connected between ground voltage GND and source line SLi, and a transistor switch 92 connected between a positive voltage V3 and source line SLi. Transistor switches 91 and 92 are each formed of an N channel MOS transistor.

Source line voltage control circuit 90 further has a logic gate 93 outputting a NAND operation result of control signal RD and row select signal RSL(i), and an inverter 94 inverting an output of logic gate 93. The output of logic gate 93 is input to the gate of transistor switch 91, and the output of inverter 94 is input to the gate of transistor switch 92. As a result, transistor switches 91 and 92 turn on and off complementarily.

Accordingly, transistor switch 91 turns on in the read sense operation period when the corresponding memory cell row is selected. Transistor switch 92 turns on in the read sense operation period when the corresponding row is not selected and also in a period other than the read sense operation period.

Figure 10:
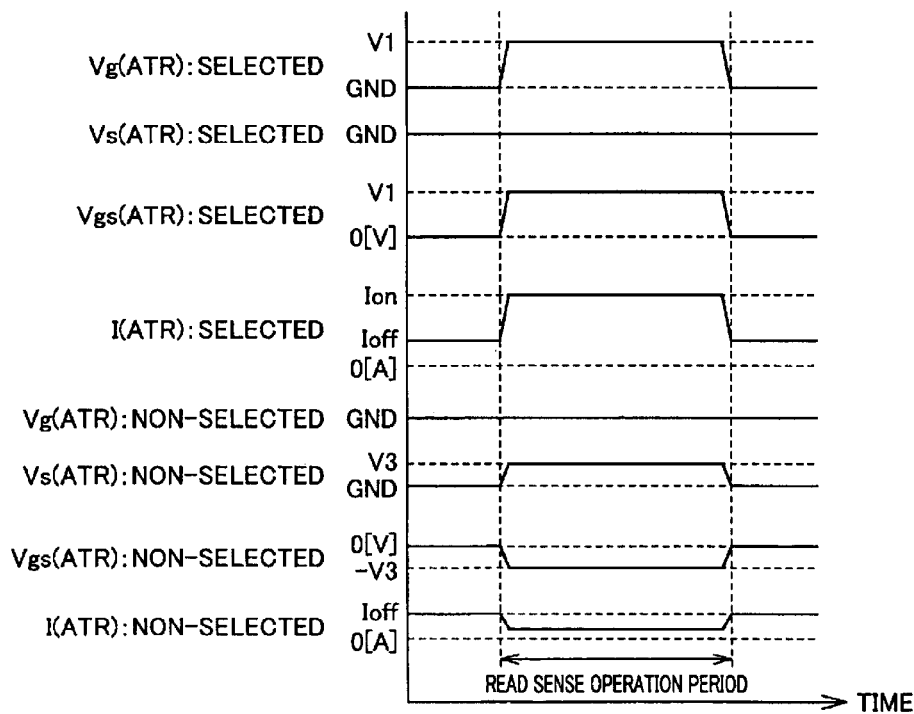
FIG. 10 shows operational waveforms illustrating gate voltages and through currents of access transistors in a data read operation according to the third embodiment.

FIG. 10 shows operational waveforms illustrating gate voltages and through currents of access transistors in a data read operation according to the third embodiment.

Referring to FIG. 10, in a period other than the read sense operation period, each word line WL is inactivated and the gate voltage Vg (ATR) of each access transistor ATR, ATRr is set to ground voltage GND, as in FIGS. 6 and 8. Source line voltage control circuit 90 connects each source line SL to ground voltage GND. As a result, each access transistor ATR, ATRr is turned off because of the gate-source voltage Vgs (ATR) of 0 [V], and off leakage current Ioff corresponding to the threshold voltage flows.

When the data read operation is started, word line WL of a selected row is activated in the read sense operation period, and gate voltages Vg (ATR) of access transistors ATR, ATRr rise from ground voltage GND to positive voltage V1. In the selected row, source line voltage control circuit 90 maintains corresponding source line SL at ground voltage GND. The gate-source voltage Vgs (ATR) thus changes to V1 (>0). In response, access transistors of the selected row are turned on as described in conjunction with FIG. 6, and the through current I (ATR) thereof changes to current Ion corresponding to the memory cell current. Positive voltage V1 needs to be set taking into consideration the threshold voltages of access transistors ATR, ATRr.

On the other hand, in the read sense operation period, word line WL of a non-selected row is inactivated and maintains ground voltage GND. In the non-selected row, source line voltage control circuit 90 connects corresponding source line SL to positive voltage V3. Thus, the gate-source voltage Vgs (ATR) changes to $-V3$, and access transistors ATR, ATRr are reverse-biased. That is, positive voltage V3 needs to be set to a level enabling reverse-bias of access transistors ATR, ATRr, taking into account the word line voltage when inactivated. As such, it is possible to restrict the off leakage current produced in the access transistors in a non-selected row in the read sense operation period.

As described above, access transistors ATR, ATRr are reverse-biased by switching the voltage of the non-selected source line in the read sense operation period. Thus, the off leakage current produced in the nonselected access transistors ATR, ATRr during the read sense operation period can be restricted. The same effect is enjoyed in reference cell RMC generating a reference current.

With such a configuration, it is possible to restrict the off leakage current produced in a non-selected memory cell and an influence of the off leakage current on the memory cell current flowing through the selected bit line, without a need to set a large threshold voltage for access transistor ATR.

Accordingly, a current difference between the memory cell current and the reference current flowing through the selected bit line and the reference bit line, respectively, comes to precisely reflect the electric resistance difference between the selected memory cell and the reference cell, so that the data read margin improves.

The configurations of the first through third embodiments above and any combination thereof are applicable, not only to the memory array of so-called "open bit line configuration" as shown in FIG. 2, but also to memory arrays of other configurations.

Figure 11:
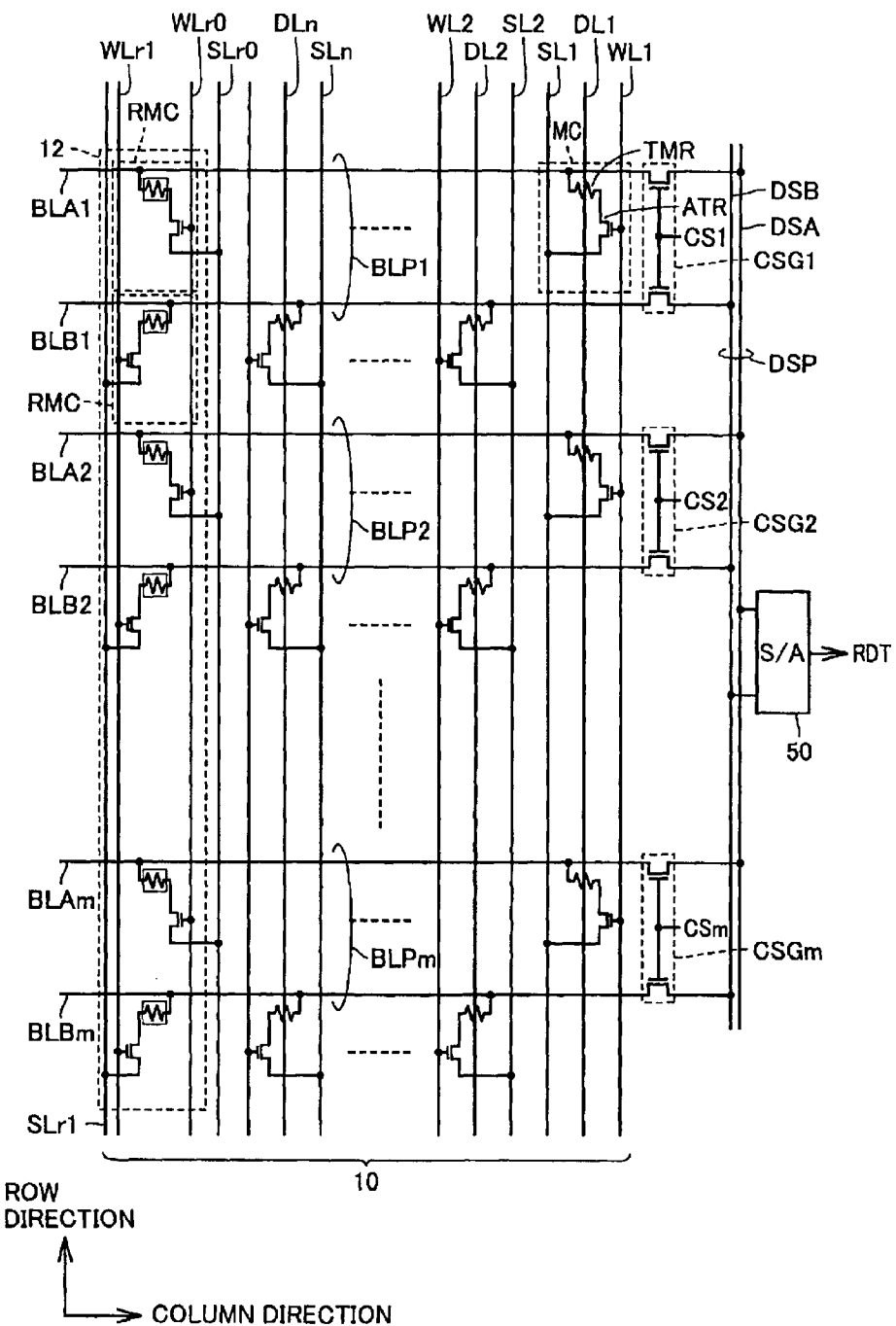
FIG. 11 is a circuit diagram showing another configuration of the memory array to which the present invention is applicable.
Figure 12:
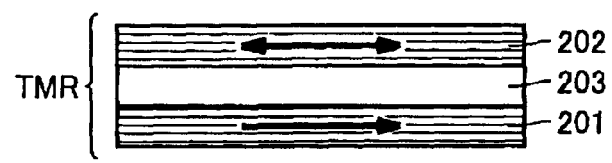
FIG. 12 is a conceptual diagram illustrating a principle for storing data in an MTJ memory cell.
Figure 13:
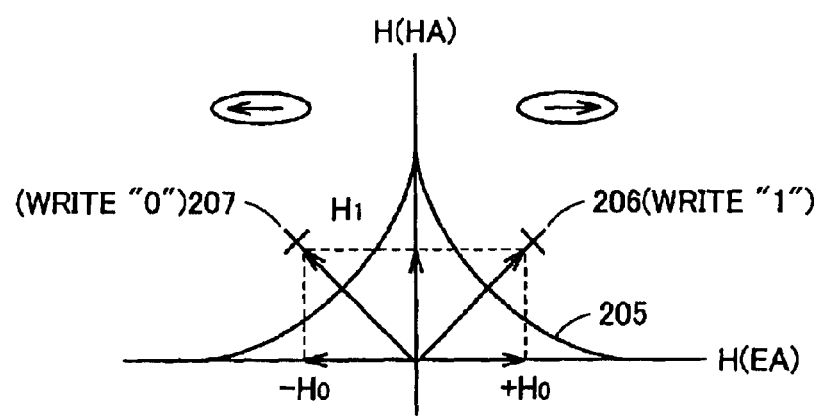
FIG. 13 is a conceptual diagram illustrating a data write magnetic field being applied to an MTJ memory cell in a data write operation.
Figure 14:
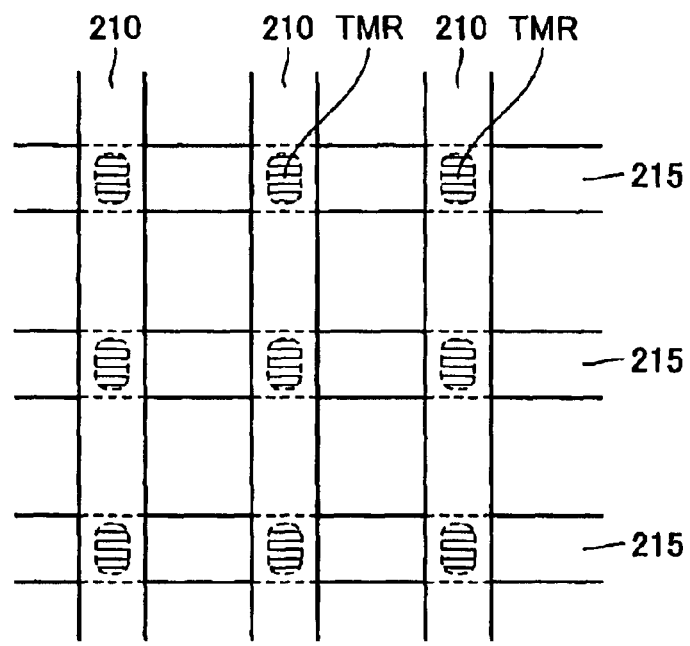
FIG. 14 is a conceptual diagram showing arrangement of data write interconnections in a memory cell array formed of MTJ memory cells.
Figure 15:
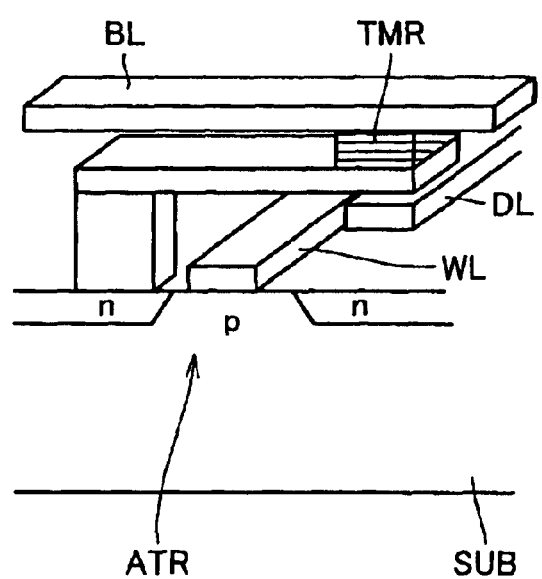
FIG. 15 is a conceptual diagram illustrating a configuration for reading data from an MTJ memory cell.

As an example of the memory arrays of other configurations to which the present invention is applicable, FIG. 11 shows a memory array of so-called "folded bit line configuration".

In the memory array configuration shown in FIG. 11, a plurality of reference cells RMC are arranged to form a reference cell row 12 to share the memory cell columns with memory cells MC. That is, reference cell row 12 is provided independently from the rows of memory cells MC (memory cell rows).

Reference cell RMC, formed as described above in conjunction with FIG. 2, has reference resistance element TMRr and access transistor ATRr connected in series. In the configuration provided with the reference cell row, word lines WL are provided separately for memory cells MC and for reference cells RMC. Thus, reference cells having desired characteristics can be implemented if reference cells RMC and memory cells MC are designed the same and the voltages of the word line for the reference cells and the word line for the memory cells at the time of activation are set different from each other.

Word lines WL1–WLn and digit lines DL1–DLn are provided corresponding to n memory cell rows, and reference word lines WLr0, WLr1 and reference source lines SLr0, SLr1 are provided corresponding to reference cell row 12. It is unnecessary to arrange a digit line for reference cell row 12, since data is not written into reference cell RMC, as described above.

Bit line pairs BLP1–BLPm are arranged corresponding to m memory cell columns shared by memory cells MC and reference cells RMC. Bit line pairs BLP1–BLPm consist of complementary bit lines BLA1, BLB1 to BLAm, BLBm. Hereinafter, bit lines BLA1–BLAm and bit lines BLB1–BLBm are also collectively referred to as bit line BLA and bit line BLB, respectively.

Memory cells MC in alternate rows are coupled to one of bit lines BLA1–BLAm and bit lines BLB1–BLBm. Specifically, memory cells MC belonging to the odd rows (e.g., the first row) are coupled to bit lines BLA1–BLAm, and memory cells MC belonging to the even rows (e.g., the second row) are coupled to bit lines BLB1–BLBm.

In each memory cell column, reference cell RMC having access transistor ATRr with its gate connected to reference word line WLr0 is connected between bit line BLA and reference source line SLr0. By comparison, reference cell RMC having access transistor ATRr with its gate connected to reference word line WLr1 is connected between bit line BLB and reference source line SLr1. In the read sense operation period at the time of data read, reference word line WLr0 is activated when an even row is selected, and reference word line WLr1 is activated when an odd row is selected.

Further, a data line pair DSP is arranged in a region adjoining memory array 10, which is shared by m memory cell columns. Data line pair DSP consists of complementary data lines DSA and DSB. Sense amplifier 50 amplifies and senses the difference of the currents passing through data lines DSA and DSB, to generate read data RDT.

Column select gates CSG1–CSGm are provided between bit lines BLA1, BLB1 to BLAm, BLBm and data lines DLA, DLB, respectively, and turn on/off corresponding to column select signals CS1–CSm. For example, column select gate CSG1 has two transistor switches that are connected between bit lines BLA1, BLB1 and data lines DLA, DLB, respectively, and each turn on/off in response to column select signal CS1.

In the data read operation, the word line of a selected row, the reference word line corresponding to the selected row and the column select signal of the selected column are activated, and thus, complementary bit lines BLA and BLB of the selected column are connected via one and the other of the selected memory cell and the corresponding reference cell to the source line of the selected row and the corresponding reference source line. Complementary bit lines BLA and BLB of the selected column are also connected via complementary data lines DSA and DSB, respectively, to sense amplifier 50. As such, it is possible to carry out data read, based on the same principle as in the case of the memory array shown in FIG. 2, in accordance with the difference of the currents passing through the complementary bit lines BLA and BLB of the selected column.

According to the folded bit line configuration described above, bit lines through which the memory cell current and the reference current flow are arranged close to each other, so that they suffer an influence of noise in approximately same degree and phase. Thus, high-precision data read with great data read margin is realized.

For the memory array configuration shown in FIG. 11, the threshold voltages of access transistors ATR, ATRr may be designed as in the first embodiment. The effect as described in the second embodiment can be enjoyed if the word line voltage control circuit as shown in FIG. 8 is arranged for each reference word line WLr0, WLr1, in addition to respective word line WL1–WLn. Alternatively, the effect as described in the third embodiment can be enjoyed if the word line voltage control circuit as shown in FIG. 10 is arranged for each reference source line SLr0, SLr1, in addition to respective source line SL1–SLn.

The configurations shown in the first through third embodiments are also applicable as combinations thereof For example, combining the first embodiment with at least one of the second and third embodiments results in a configuration where MOS transistors of large threshold voltages are employed to physically restrict the off leakage current of the access transistors, and the voltage control is additionally applied to further restrict the off leakage current. Alternatively, combining the second and third embodiments permits control of both the gate voltage and the source voltage of the access transistors of a non-selected row, so that the off leakage current can be restricted even if MOS transistors having small threshold voltages are employed as the access transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
    a plurality of memory cells arranged in rows and columns;
    a plurality of word lines provided corresponding to said rows, and selectively activated in the row including a selected memory cell that is selected from among said plurality of memory cells as a data read target;
    a plurality of bit lines arranged corresponding to said columns; and
    a data read circuit generating read data based on a current passing through that one of said plurality of bit lines which corresponds to said selected memory cell;
    said plurality of memory cells each including a magnetic storage element having an electric resistance changing in accordance with stored data and an access element turning on in response to activation of corresponding one of said word lines which are connected in series between corresponding one of said plurality of bit lines and a fixed voltage,
    said access element having a first field effect transistor with a gate coupled to said corresponding one of said word lines, and said first field effect transistor having a threshold voltage that is greater than a threshold voltage of another field effect transistor arranged on a same chip.

2. The thin film magnetic memory device according to claim 1, further comprising an interface circuit for outputting said read data generated by said data read circuit to an outside of said thin film magnetic memory device, an absolute value of the threshold voltage of said first field effect transistor being designed to substantially equal a threshold voltage of a field effect transistor forming said interface circuit.

3. The thin film magnetic memory device according to claim 1, wherein said first field effect transistor is of an N channel type, and each said word line is set to a positive voltage greater than said threshold voltage of said first field effect transistor when activated, and set to a ground voltage when inactivated.

4. The thin film magnetic memory device according to claim 1, further comprising:

a plurality of digit lines provided corresponding to said rows, and selectively activated in the row including the memory cell selected as a data write target; and a plurality of digit line drive circuits provided corresponding to said plurality of digit lines;

each said digit line drive circuit having a second field effect transistor for supplying a data write current causing a data write magnetic field when corresponding one of said digit lines is activated, and said first field effect transistor having a threshold voltage that is greater than a threshold voltage of said second field effect transistor.

5. The thin film magnetic memory device according to claim 1, further comprising a plurality of bit line drivers provided corresponding to said columns;

each said bit line driver including a second field effect transistor for supplying a data write current causing a data write magnetic field to corresponding one of said bit lines in the column including the memory cell selected as the data write target, and the absolute value of the threshold voltage of said first field effect transistor being greater than an absolute value of a threshold voltage of said second field effect transistor.

6. The thin film magnetic memory device according to claim 1, wherein said data read circuit includes a field effect transistor having an absolute value of a threshold voltage that is smaller than the absolute value of the threshold voltage of said first field effect transistor.

7. A thin film magnetic memory device, comprising:

a plurality of memory cells arranged in rows and columns;

a plurality of word lines provided corresponding to said rows, and selectively activated in the row including a selected memory cell that is selected from among said plurality of memory cells as a data read target;

a plurality of word line voltage control circuits provided corresponding to said plurality of word lines for setting the word line of a selected row and the word line of a non-selected row to a first voltage and a second voltage, respectively, in a data read period;

a plurality of bit lines arranged corresponding to said columns; and a data read circuit generating read data based on a current passing through that one of said bit lines which corresponds to said selected memory cell;

said plurality of memory cells each including a magnetic storage element having an electric resistance changing in accordance with stored data and an access element turning on in response to activation of corresponding one of said word lines which are connected in series between corresponding one of said plurality of bit lines and a fixed voltage, said access element having a field effect transistor with a gate coupled to said corresponding one of said word lines, and said first and second voltages having different polarities from each other with respect to said fixed voltage.

8. The thin film magnetic memory device according to claim 7, wherein said field effect transistor is of an N channel type, and said fixed voltage corresponds to a ground voltage, said first voltage is a positive voltage greater than a threshold voltage of said field effect transistor, and said second voltage is a negative voltage.

9. The thin film magnetic memory device according to claim 7, wherein said plurality of word line voltage control circuits each set said corresponding one of said word lines to said fixed voltage in a period other than said data read period.

10. The thin film magnetic memory device according to claim 9, wherein said plurality of word line voltage control circuits each include a first switch connected between said first voltage and said corresponding one of said word lines, a second switch connected between said second voltage and said corresponding one of said word lines, and a third switch connected between said fixed voltage and said corresponding one of said word lines and turning on in the period other than said data read period, and said first and second switches complementarily turn on/off in said data read period according to whether the corresponding row includes said selected memory cell.

11. A thin film magnetic memory device, comprising:

a plurality of memory cells arranged in rows and columns;

a plurality of word lines provided corresponding to said rows, and selectively activated in the row including a selected memory cell that is selected from among said plurality of memory cells as a data read target;

a plurality of source lines provided corresponding to said rows;

a plurality of bit lines arranged corresponding to said columns; and a data read circuit generating read data based on a current passing through that one of said plurality of bit lines which corresponds to said selected memory cell, said plurality of memory cells each including a magnetic storage element having an electric resistance changing in accordance with stored data and an access element turning on in response to activation of corresponding one of said word lines which are connected in series between corresponding one of said plurality of bit lines and corresponding one of said plurality of source lines, said access element having a field effect transistor with a gate coupled to said corresponding one of said word lines; and a plurality of source line voltage control circuits provided corresponding to said plurality of source lines, said plurality of source line voltage control circuits, in a data read period, switching a voltage of the source line having the corresponding word line inactivated, to a level enabling reverse-bias of said field effect transistor.

12. The thin film magnetic memory device according to claim 11, wherein said field effect transistor is of an N channel type, and said plurality of source line voltage control circuits each set corresponding one of said source lines to a positive voltage when corresponding one of said word lines is inactivated in said data read period, and otherwise set said corresponding one of said source lines to a ground voltage.

13. The thin film magnetic memory device according to claim 11, wherein said plurality of source line voltage control circuits each include a first switch connected between said positive voltage and said corresponding one of said source lines and a second switch connected between said ground voltage and said corresponding one of said source lines and turning on complementarily to said first switch, and said second switch turns on in said data read period and when the corresponding row includes said selected memory cell.

* * * * *